(12) United States Patent
Rosen

(10) Patent No.: US 7,171,574 B2
(45) Date of Patent: Jan. 30, 2007

(54) DDR CLOCKING

(75) Inventor: Eitan Rosen, Abirim, IL (US)

(73) Assignee: Marvell Semiconductor Israel Ltd.

( * ) Notice: Subject to any disclaimer, the term of this patent is extended or adjusted under 35 U.S.C. 154(b) by 419 days.

(21) Appl. No.: 10/641,706

(22) Filed: Aug. 15, 2003

(65) Prior Publication Data

US 2004/0163006 A1    Aug. 19, 2004

Related U.S. Application Data

(60) Provisional application No. 60/448,002, filed on Feb. 18, 2003.

(51) Int. Cl.
*G06F 1/04* (2006.01)
(52) U.S. Cl. ...................... 713/401; 713/503
(58) Field of Classification Search ........ 713/400–500, 713/503, 600
See application file for complete search history.

(56) References Cited

U.S. PATENT DOCUMENTS

| | | | |
|---|---|---|---|
| 6,466,075 B2 | 10/2002 | Douchi et al. | |
| 6,510,095 B1 | 1/2003 | Matsuzaki et al. | |
| 6,510,503 B2* | 1/2003 | Gillingham et al. | ........ 71/167 |
| 6,525,988 B2 | 2/2003 | Ryu et al. | |
| 6,529,993 B1 | 3/2003 | Rogers et al. | |
| 6,704,881 B1* | 3/2004 | Li et al. | ............ 713/401 |
| 2002/0089359 A1 | 7/2002 | Friedman et al. | |
| 2002/0157031 A1* | 10/2002 | Lin | ............ 713/401 |

* cited by examiner

*Primary Examiner*—Dennis M. Butler

(57) ABSTRACT

A sampling device includes a first delay circuit and a second delay circuit in a parallel configuration, where the first delay circuit and the second delay circuit are responsive to a clock signal. A data sampling circuit may use an output of the first delay circuit and an output of the second delay circuit to sample a data signal synchronized with the clock signal. The data signal and the clock signal may be synchronized according to a double data rate (DDR) protocol.

39 Claims, 6 Drawing Sheets

DDR CLOCKING

CROSS-REFERENCE TO RELATED APPLICATIONS

The present application claims priority to commonly assigned U.S. Provisional Patent Application No. 60/448,002, filed on Feb. 18, 2003, which is hereby incorporated by reference in its entirety.

TECHNICAL FIELD

This invention relates to systems implementing double data rate (DDR) protocol.

BACKGROUND

DDR protocol refers to a data transfer protocol that allows for data to be fetched on both the rising and falling edges of a clock (referred to as a data strobe or DQS), thus doubling the effective data transfer rate.

According to DDR protocol, data transfer is source-synchronized. That is, a device transmitting data according to the DDR protocol transmits a clock signal along with the data signal, where the data signal is synchronized with the clock signal.

A device receiving the data uses the clock signal to sample the data at the appropriate times. FIG. 1 shows a clock signal 110 and a data signal 120 to be sampled. The portion of data signal 120 shown includes five bits of data, with a first bit 122 equal to a logical zero, second bit 123 equal to a logical one, third bit 124 equal to a logical one, fourth bit 125 equal to a logical zero, and fifth bit 126 equal to a logical zero.

For accurate data sampling, data should be sampled at a time when the data signal not changing. That is, rather than sampling the data signal close to a rising or falling edge (e.g., at a time $t_1$ or a time $t_2$), the data should be sampled at a time during which the signal is not changing (e.g., at a time $t_3$).

FIG. 2 shows a schematic of a system 200 for sampling a data signal between a successive edges of a clock signal, according to the prior art. FIG. 3 shows waveforms that are generated using system 200, as described below.

System 200 includes a clock receiver 210 and a data receiver 220. Clock receiver 210 drives a clock signal 310, while data receiver 220 drives a data signal synchronized with the clock signal.

Clock signal 310 is input to a series of four identical delay elements 230A–230D. A controller 260 controls the amount of the delay so that each of the delay elements 230A–230D delays the signal received at its input by a time equal to one fourth of the time between successive falling edges.

For the symmetric clock signal shown in FIG. 3 (e.g., for $T_1$ equal to $T_2$), the output of delay element 230A is a delayed signal 320, where delayed signal 320 is out of phase with clock signal 310 by 90 degrees. The output of delay element 230B is a delayed signal 330, which is out of phase with clock signal 310 by 180 degrees. The output of delay element 230C is a delayed signal 340, which is out of phase with clock signal 310 by 270 degrees. Finally, the output of delay element 230D is a delayed signal 350, which is in phase with clock signal 310.

In order to adjust the delay of delay elements 230A–230D to be equal to one fourth of the time between successive falling edges, the output of delay element 230D is input to a phase detector 250, as is the un-shifted clock signal. If the delay is correctly adjusted, the output of delay element 230D will be in phase with the un-shifted clock signal (it will have been delayed by exactly one full period of the clock signal). However, if the delay is not correctly adjusted, the output of delay element 230D will be out of phase with the un-shifted clock signal.

Phase detector 250 outputs a signal reflecting any difference in phase between the output of delay element 230D and the un-shifted clock signal. The output of phase detector 250 is provided to a controller 260, which adjusts the delay of delay elements 230A to 230D to reduce the phase difference.

In order to sample the data signal at the appropriate times, delayed signal 320 (i.e., the output of delay element 230A) is provided to a data sampling circuit 225. Data sampling circuit 225 samples data in the data signal on the rising edges of delayed signal 320. For the symmetric clock signal 310 shown in FIG. 3, the rising edges of delayed signal 320 correspond to a mid-point between a rising edge and the successive falling edge of clock signal 310. However, if the duty cycle of clock signal 310 is different than 50% for each half of the signal, the rising edges of delayed signal 320 will be displaced from the mid-point.

Delayed signal 320 is also provided to an inverter 240. For an ideal inverter, the output of inverter 240 is an inverted delayed signal 325. For an ideal inverter and for the symmetric clock signal 310 shown in FIG. 3, the rising edges of inverted delayed signal 325 correspond to the mid-point between a falling edge and a subsequent rising edge of clock signal 310.

However, inverting the output of delay element 230A generally introduces an inverter delay. Thus, the output of a real inverter 240 is an inverted delayed signal 325'. Data sampling circuit 225 samples data in the data signal on the rising edges of inverted delayed signal 325', which is displaced from the mid-point between the falling edge and subsequent rising edge of clock signal 310 by an amount equal to $t_{delay}$.

SUMMARY

In general, in one aspect a sampling device includes a first delay circuit and a second delay circuit in a parallel configuration. The first delay circuit and the second delay circuit may be responsive to a clock signal. The device may further include control circuitry responsive to an output of the first delay circuit and the clock signal. The control circuitry may adjust a delay amount of the first delay circuit based on a difference between the output of the first delay circuit and the clock signal. The control circuitry may further adjust a delay amount of the second delay circuit based on a difference between the output of the second delay circuit and the clock signal.

The device may further include data sampling circuitry responsive to a data signal synchronized with the clock signal. The data signal may be synchronized with the clock signal according to a double data rate (DDR) protocol. The data sampling circuitry may be responsive to a sampling output of the first delay circuit. The data sampling circuitry may further be responsive to a sampling output of the second delay circuit.

The first delay circuit may include a first delay element responsive to the clock signal and a second delay element responsive to an output of the first delay element. The first delay element and the second delay element may output a signal that is delayed by the same delay amount with respect to the input signal.

The second delay circuit may include a first inverting delay element responsive to the clock signal and a second inverting delay element responsive to an output of the first inverting delay element. The first inverting delay element and the second inverting delay element may output a signal that is delayed by the same delay amount with respect to the input signal.

The control circuitry may include a comparator responsive to the output of the first delay circuit and responsive to the clock signal. The control circuitry may further include a controller responsive to an output of the comparator, the controller to adjust a delay amount of the first delay circuit based on the output of the comparator. The comparator may comprise an inverting phase detector, which may include a phase difference circuit and a sense amplifier. The inverting phase detector may further comprise a latch. In some implementations, the inverting phase detector may comprise a flip flop.

In general, in one aspect, a method may include receiving a clock signal synchronized with a data signal. The method may further include generating a first sampling signal based on the clock signal, where the first sampling signal is delayed by a first delay with respect to the clock signal. The method may further include generating a second sampling signal based on the clock signal, the second sampling signal delayed by a second delay with respect to the clock signal, the second delay different than the first delay. The method may further include sampling the data signal based on the first sampling signal, and may further include sampling the data signal based on the second sampling signal.

Sampling the data signal based on the first sampling signal may comprise sampling the data signal at a midpoint between a first edge and a second edge of the clock signal, where the second edge is the next successive edge of the clock signal after the first edge. Sampling the data signal based on the second sampling signal may comprise sampling the data signal at a midpoint between the second edge of the clock signal and a third edge of the clock signal, wherein the third edge is the next successive edge of the clock signal after the second edge.

The method may further include generating a first locking signal delayed by twice the first delay with respect to the clock signal, and may include comparing the first locking signal to the clock signal. The method may further include modifying the first delay based on the comparing. The method may further include generating a second locking signal delayed by twice the second delay with respect to the clock signal, comparing the second locking signal to the clock signal, and modifying the second delay based on the comparing.

In general, in one aspect, a sampling device includes a first delaying means and a second delaying means in a parallel configuration, where the first delaying means and the second delaying means are for receiving a clock signal and for generating one or more delayed signals based on the clock signal. The device may further include controlling means responsive to an output of the first delaying means and the clock signal, where the controlling means is for adjusting a delay amount of the first delaying means based on a difference between the output of the first delaying means and the clock signal. The controlling means may be further responsive to an output of the second delaying means, and may be for adjusting a delay amount of the second delaying means based on a difference between the output of the second delaying means and the clock signal.

The device may further include data sampling means for sampling a data signal synchronized with the clock signal. The data sampling means may be for sampling the data signal based on a sampling output of the first delaying means. The data sampling means may further be for sampling the data signal based on a sampling output of the second delaying means.

The details of one or more implementations are set forth in the accompanying drawings and the description below. Other features and advantages will be apparent from the description and drawings, and from the claims.

DESCRIPTION OF DRAWINGS

Like reference symbols in the various drawings indicate like elements.

DETAILED DESCRIPTION

For a symmetric clock signal (i.e., a duty cycle of 50% for each half of the clock signal period), the data sampling scheme described above and illustrated in FIGS. 2 and 3 samples a first data bit at a midpoint between a rising edge and the subsequent falling edge of the clock signal. However, due to an inverter delay, a second data bit is sampled at a time $t_{delay}$ after the midpoint between a falling edge and the subsequent rising edge of the clock signal. Depending on the frequency and shape of the clock signal and the delay time $t_{delay}$, this may affect the ability of the system to accurately sample data.

An additional problem arises when the duty cycle of each half of the clock signal is different than 50%. That is, if the time denoted in FIG. 3 as $T_1$ is different than the time denoted by $T_2$, the data signal will not be sampled at the mid-point between subsequent edges. Again, depending on the magnitude of the difference between $T_1$ and $T_2$ and the shape and frequency of the clock signal, this may affect the ability of the system to accurately sample data.

Figure 4:
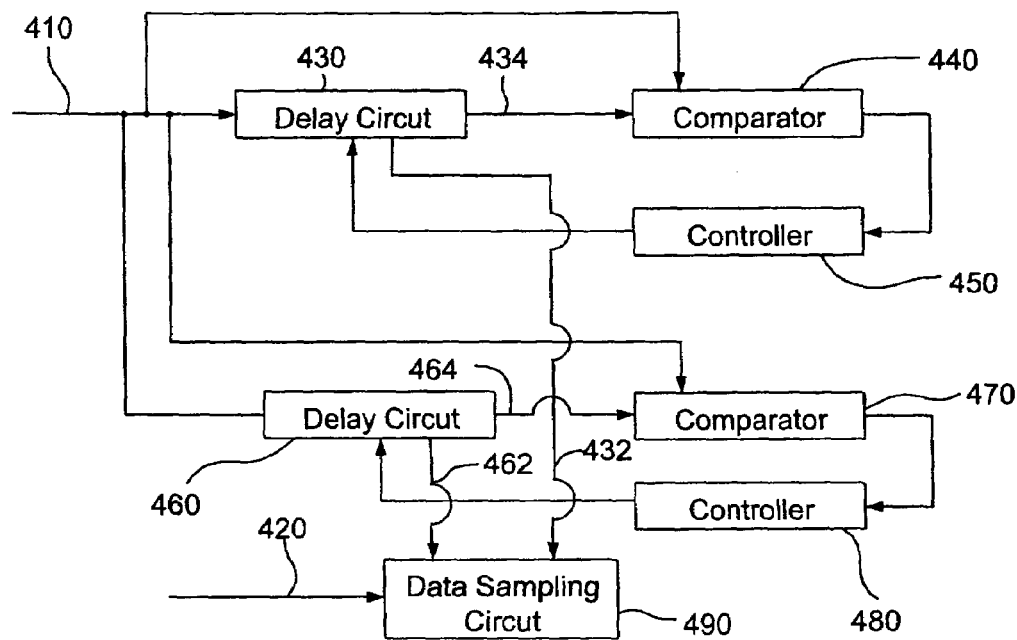
FIG. 4 is a schematic of a system for sampling data according to an embodiment.

FIG. 4 shows an implementation of a system 400 for improved sampling of a data signal transmitted according to DDR protocol. System 400 includes a first delay circuit 430 and a second delay circuit 460 to receive a clock signal 410. A data signal 420 is synchronized with clock signal 410, and is sampled using a data sampling circuit 490 as explained below.

First delay circuit 430 and second delay circuit 460 are in a parallel configuration. That is, both first delay circuit 430 and second delay circuit 460 receive the clock signal and produce one or more delayed signals based on the clock signal.

For example, first delay circuit 430 receives clock signal 410 and produces a first delayed signal 432 and a second delayed signal 434. First delayed signal 432 (which may be referred to as a sampling signal) is provided to data sampling circuit 490. Second delayed signal 434 (which may be referred to as a locking signal) is provided to a first comparator circuit 440, as is clock signal 410. An output of first comparator circuit 440 reflects a difference between clock signal 410 and second delayed signal 434 (e.g., a phase difference), and is provided to a controller 450. Controller 450 may output a signal to adjust a delay amount in first delay circuit 430 based on the output of first comparator circuit 440.

Second delay circuit 460 receives clock signal 410 and produces a third delayed signal 462 and a fourth delayed signal 464. Third delayed signal 462 (a sampling signal) is provided to data sampling circuit 490. Fourth delayed signal 464 (a locking signal) is provided to a second comparator circuit 470, as is clock signal 410. An output of second comparator circuit 470 reflects a difference between clock signal 410 and fourth delayed signal 464, and is provided to a controller 480. Controller 480 may output a signal to adjust a delay amount in second delay circuit 460 based on the output of second comparator circuit 470.

Controller 450 and controller 480 control delay of first delay circuit 430 and second delay circuit 460 independently. That is, controller 450 may set a delay of first delay circuit 430 to a different amount than a delay of second delay circuit 430. In an implementation, controller 450 and controller 480 are configured so that first delayed signal 432 and third delayed signal 462 may be used by data sampling circuit 490 to sample data signal 420 at the midpoints between successive edges of clock signal 410.

This may be accomplished as follows. First delay circuit 430, first comparator 440, and controller 450 may be configured so that first delayed signal 432 is delayed by an amount equal to half the time between a first edge of clock signal 410 and a second edge of clock signal 410, where the second edge of clock signal 410 is the next successive edge.

Similarly, second delay circuit 460, second comparator 470, and controller 480 may be configured so that third delayed signal 434 is delayed by an amount equal to half the time between the second edge of clock signal 410 and a third edge of clock signal 410, where the third edge of clock signal 410 is the next successive edge (and is the same edge type as the first edge).

In such a system, data sampling circuit 490 uses first delayed signal 432 to sample data at the midpoint between the first edge and the second edge, while data sampling circuit 490 uses third delayed signal 462 to sample data at the midpoint between the second edge and the third edge. The process is iterated so that each bit of data signal 420 is sampled at a midpoint between an edge of clock signal 410 and the next successive edge.

Figure 5:
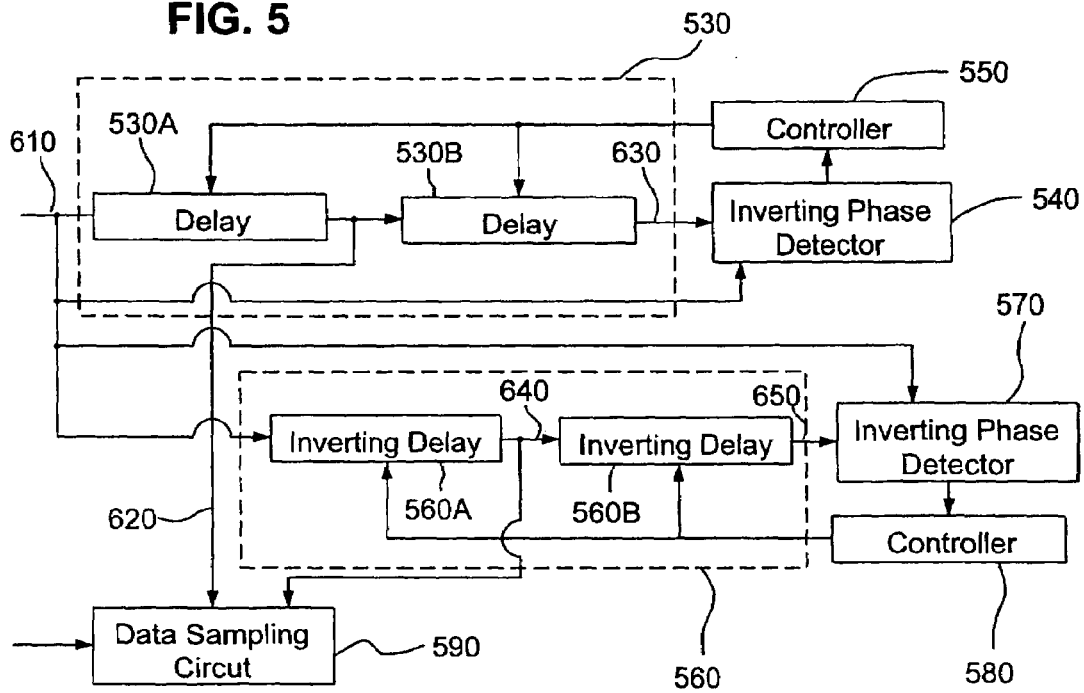
FIG. 5 is a schematic of a system for sampling data according to another embodiment.
Figure 6:
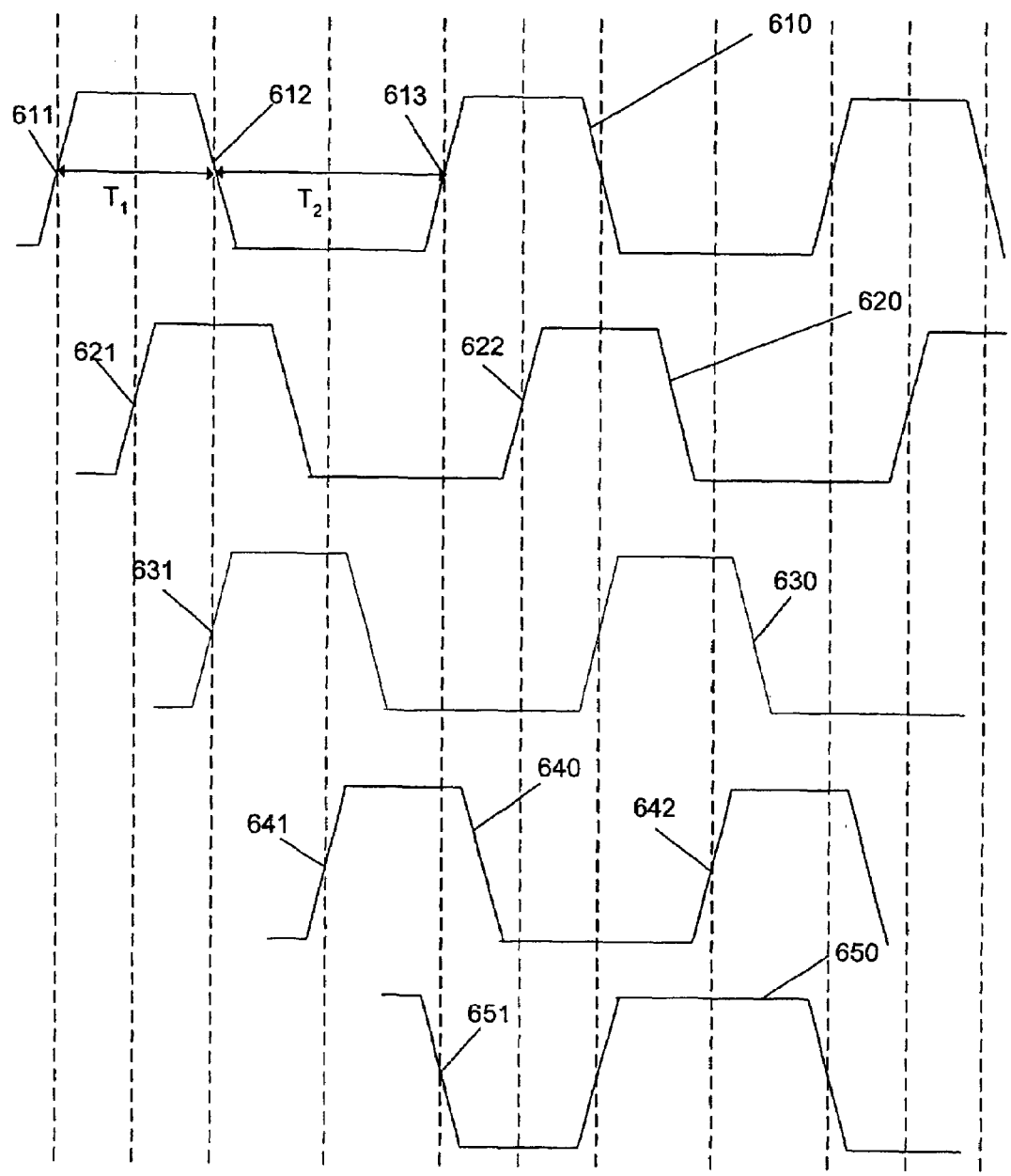
FIG. 6 is a plot of waveforms produced using a system such as that shown in FIG. 5.

FIG. 5 shows a particular implementation of a system 500 for sampling a data signal at the midpoints between successive edges of a clock signal. FIG. 6 shows waveforms that may be produced using system 500.

System 500 includes a first delay circuit 530 and a second delay circuit 560 in a parallel configuration. First delay circuit 530 and second delay circuit 560 each receive a clock signal 610 with a first edge 611, a second edge 612, and a third edge 613. Clock signal 610 is synchronized with a data signal to be sampled (not shown).

First delay circuit 530 includes a first delay element 530A and a second delay element 530B in a series configuration. First delay element 530A receives clock signal 610 and produces a delayed signal 620. Second delay element 530B receives delayed signal 620 and produces a delayed signal 630. Delayed signal 630 is provided to an inverting phase detector 540, which also receives clock signal 610.

Controller 550 controls the delay of delay elements 530A and 530B so that edge 621 of delayed signal 620 coincides with a midpoint between edge 611 and edge 612 of clock signal 610. For example, the delay of delay elements 530A and 530B is set to be equal, with the total delay equal to $T_1$ (so that each of the delay elements produces an output signal that is delayed with respect to its input signal by a time equal to $T_1/2$).

Thus, edge 631 of delayed signal 630 should be exactly out of phase with second edge 612 of clock signal 610. Inverting phase detector 540 (an implementation of which is described more fully below) outputs a signal that reflects any difference between the actual phase difference between delayed signal 630 and clock signal 610 and the desired phase difference. Controller 550 may then adjust the delay of delay elements 530A and 530B accordingly.

Second delay circuit 560 includes a first inverting delay element 560A and a second inverting delay element 560B in a series configuration. First inverting delay element 560A receives clock signal 610 and produces an inverted delayed signal 640. Second inverting delay element 560B receives delayed signal 640 and produces a delayed signal 650. Delayed signal 650 is provided to an inverting phase detector 570, which also receives clock signal 610.

Controller 580 controls the delay of inverting delay elements 560A and 560B so that edge 641 of delayed signal 640 coincides with a midpoint between edge 612 and edge 613 of clock signal 610. The delay of inverting delay elements 560A and 560B may be set to be equal, with the total delay equal to $T_2$ (so that each of the delay elements produces an output signal that is delayed with respect to its input signal by a time equal to $T_2/2$).

Thus, edge 651 of delayed signal 650 should be exactly out of phase with edge 613 of clock signal 610. Inverting phase detector 570 outputs a signal that reflects any difference between the actual phase difference between delayed signal 650 and clock signal 610 and the desired phase difference. Controller 580 may then adjust the delay of inverting delay elements 560A and 560B accordingly.

Data sampling circuit 590 may sample a data signal as follows. Delayed signal 620 and delayed signal 640 are provided to data sampling circuit 590, as is a data signal synchronized with clock signal 610. Data sampling circuit 590 samples the data signal on the rising edges of delayed signal 620 (e.g., edges 621 and 622). Data sampling circuit 590 also samples the data signal on the rising edges of delayed signal 640 (e.g., edges 641 and 642). Thus, data sampling circuit 590 samples the data signal at the midpoints between successive edges of clock signal 610.

Figure 1:
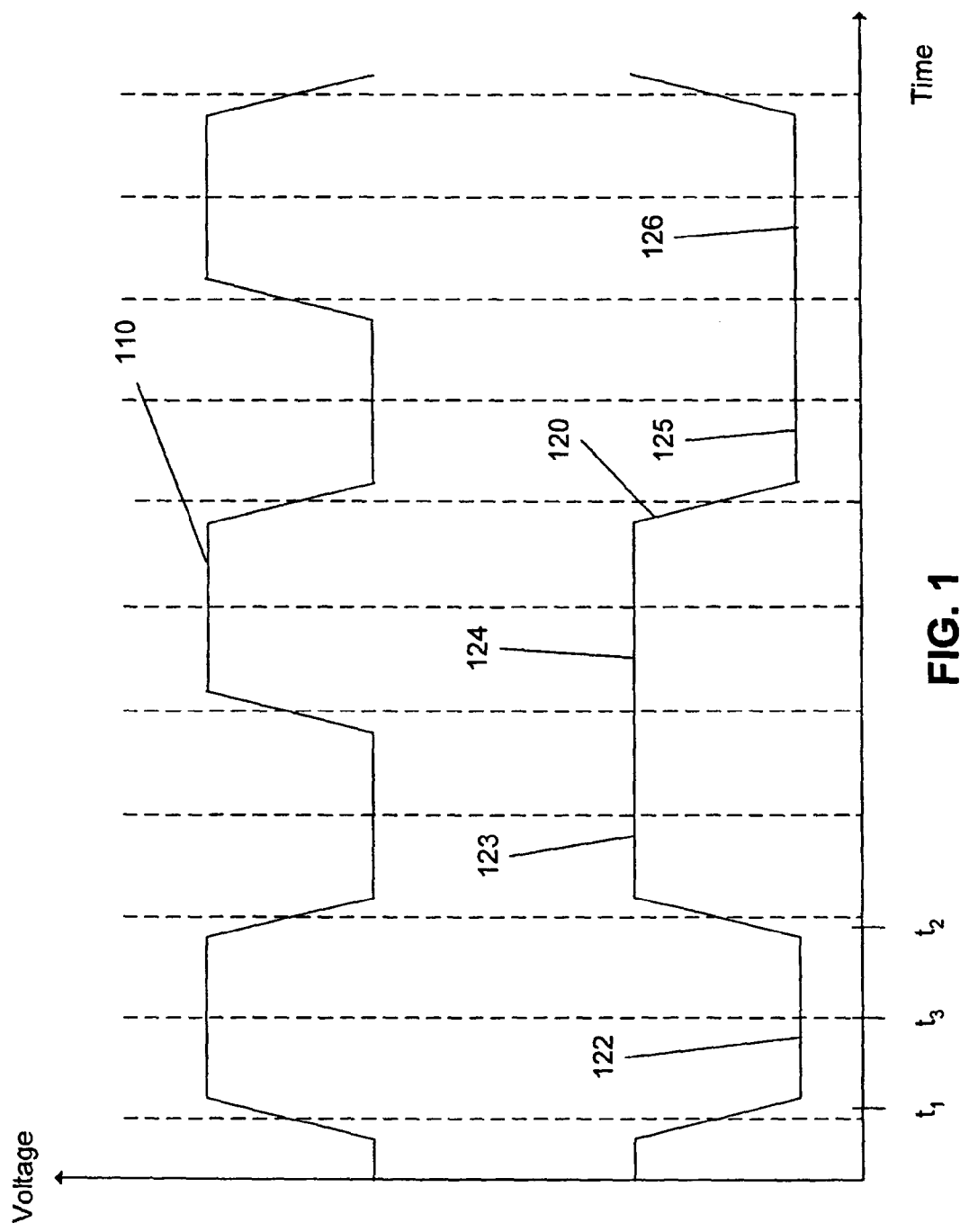
FIG. 1 is a plot of a clock signal and a data signal for DDR data transfer.
Figure 2:
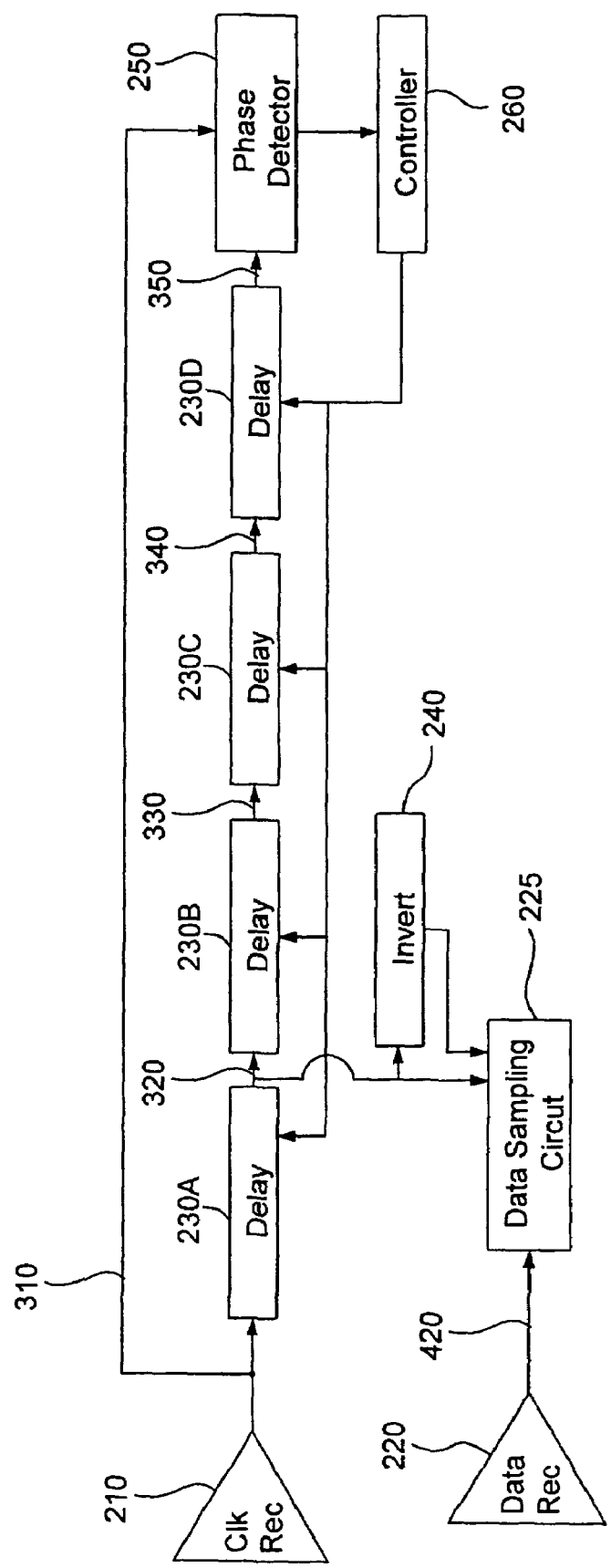
FIG. 2 is a schematic of a system for sampling data according to the prior art.
Figure 3:
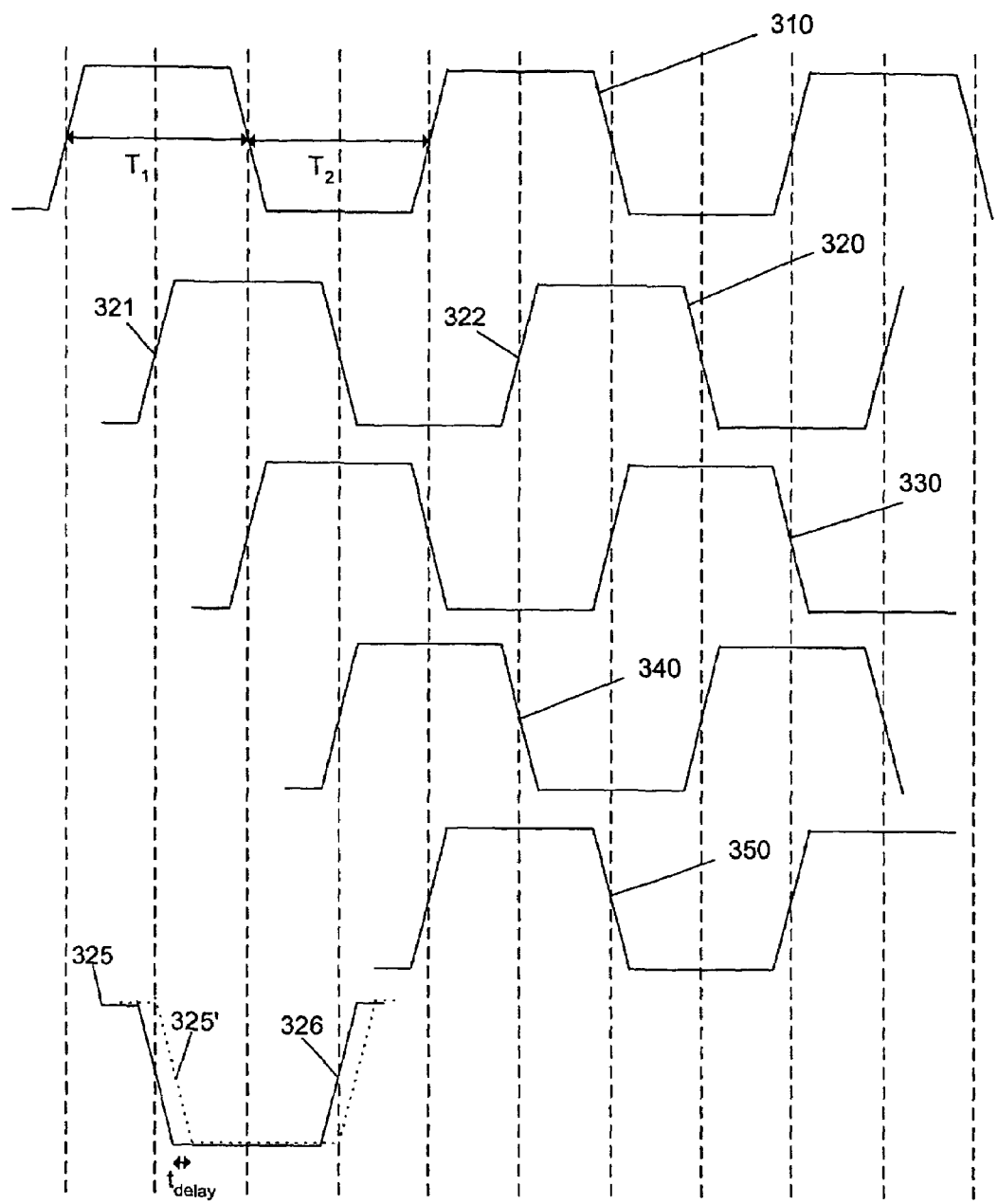
FIG. 3 is a plot of waveforms produced using a system such as that shown in FIG. 2.

The systems and techniques described above thus eliminate the inverter delay found in systems such as system 200 of FIG. 2. Additionally, the data is sampled at the midpoint between successive edges of a clock signal, even when the clock signal is asymmetric. Thus, the above systems and techniques may provide for more accurate data sampling, and may allow higher frequencies to be used.

Figure 7:
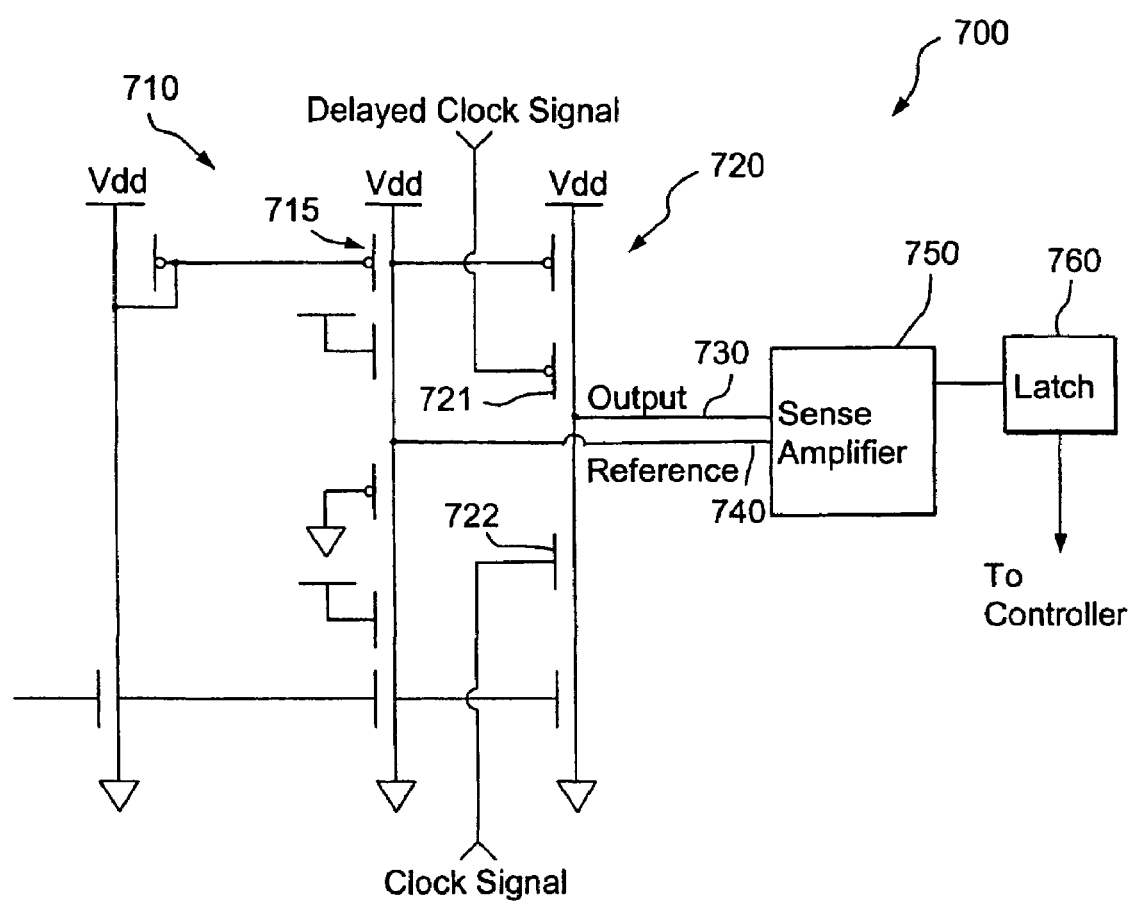
FIG. 7 is a schematic of an embodiment of an inverting phase detector.

FIG. 7 shows an implementation of an inverting phase detector 700 that may be used in implementations such as the one described above. Detector 700 includes a phase difference circuit 710 including a first stack 715 of two p-transistors and two n-transistors, as well as a second stack 720 of two p-transistors and two n-transistors.

A delayed clock signal (e.g., signal 630 or 650 of FIG. 6) is provided to a gate of a p-transistor 721 of stack 720. A DDR clock signal (e.g., signal 610 of FIG. 6) is provided to a gate of n-transistor 722 of stack 720. The voltage of an output 730 of circuit 710 with respect to a reference 740 reflects a difference between the actual phase difference between delayed signal and the clock signal and the desired phase difference (e.g., the output reflects whether a rising edge of the delayed signal coincides with a falling edge of the clock signal) as follows.

If the delayed signal and the clock signal change at the same time, the voltage of output 730 is equal to the voltage at reference 740. However, if one of the signals starts to change voltage levels before the other signal, a voltage difference will result, with the sign of the voltage difference indicating which signal is leading the other.

For example, if the delayed signal starts increasing from a logical zero to a logical one before the clock signal starts changing from a logical one to a logical zero, p-transistor 721 will begin to turn off. The voltage at output 730 will begin to decrease. In contrast, if the clock signal starts changing from a logical one to a logical zero first, n-transistor 722 will begin to turn off, and the voltage at output 730 will rise.

Sense amplifier 750 senses whether the voltage of output 730 is greater than or less than reference voltage 740. The output of sense amplifier 750 is latched using a latch 760, and provided to a controller. The controller may then adjust the delay of a delay circuit appropriately (e.g., so that the clock signal and delayed signals change at the same time and are thus exactly out of phase, as desired). Other implementations of inverting phase detectors may be used; for example, inverting phase detectors may be implemented using simple flip flop designs.

A number of implementations have been described. Nevertheless, it will be understood that various modifications may be made without departing from the spirit and scope of the invention. For example, although comparator circuits (e.g., phase detectors) and controller circuits corresponding to different delay circuits are shown as physically separate, they need not be. Accordingly, other implementations are within the scope of the following claims.

What is claimed is:

1. A sampling device, comprising:
  a first delay circuit and a second delay circuit in a parallel configuration, the first delay circuit and the second delay circuit responsive to a clock signal, each of the first and second delay circuits being independent and providing separate output signals to a sampling circuit;
  control circuitry responsive to an output of the first delay circuit and the clock signal, the control circuitry to adjust a delay amount of the first delay circuit based on a difference between the output of the first delay circuit and the clock signal, the control circuitry further responsive to an output of the second delay circuit, the control circuitry further to adjust a delay amount of the second delay circuit based on a difference between the output of the second delay circuit and the clock signal.

2. The device of claim 1, further including data sampling circuitry, the data sampling circuitry responsive to a data signal synchronized with the clock signal.

3. The device of claim 2, wherein the data sampling circuitry is further responsive to a sampling output of the first delay circuit.

4. The device of claim 2, wherein the data sampling circuitry is further responsive to a sampling output of the second delay circuit.

5. A sampling device, comprising
  a first delay circuit and a second delay circuit in a parallel configuration, the first delay circuit and the second delay circuit responsive to a clock signal, wherein the first delay circuit includes a first delay element responsive to the clock signal and a second delay element responsive to an output of the first delay element;
  control circuitry responsive to an output of the first delay circuit and the clock signal, the control circuitry to adjust a delay amount of the first delay circuit based on a difference between the output of the first delay circuit and the clock signal, the control circuitry further responsive to an output of the second delay circuit, the control circuitry further to adjust a delay amount of the second delay circuit based on a difference between the output of the second delay circuit and the clock signal.

6. The device of claim 5, further including data sampling circuitry responsive to a sampling output of the first delay element.

7. The device of claim 1, wherein the second delay circuit includes a first inverting delay element responsive to the clock signal and a second inverting delay element responsive to an output of the first inverting delay element.

8. The device of claim 1, wherein the control circuitry includes a comparator responsive to the output of the first delay circuit and responsive to the clock signal, and wherein the control circuitry further includes a controller responsive to an output of the comparator, the controller to adjust the delay amount of the first delay circuit based on the output of the comparator.

9. A sampling device, comprising:
  a first delay circuit and a second delay circuit in a parallel configuration, the first delay circuit and the second delay circuit responsive to a clock signal; and
  control circuitry responsive to an output of the first delay circuit and the clock signal, the control circuitry to adjust a delay amount of the first delay circuit based on a difference between the output of the first delay circuit and the clock signal, the control circuitry further responsive to an output of the second delay circuit, the control circuitry further to adjust a delay amount of the second delay circuit based on a difference between the output of the second delay circuit and the clock signal, the control circuitry includes a comparator responsive to die output of the first delay circuit and responsive to the clock signal and wherein the control circuitry further includes a controller responsive to an output of the comparator, the controller to adjust the delay amount of the first delay circuit based on the output of the comparator, wherein the comparator comprises an inverting phase detector.

10. The device of claim 9, wherein the inverting phase detector comprises a phase difference circuit and a sense amplifier.

11. The device of claim 10, wherein the inverting phase detector further comprises a latch.

12. The device of claim 9, wherein the inverting phase detector comprises a flip flop.

13. The device of claim 8, wherein the control circuitry further includes a different comparator responsive to the output of the second delay circuit and responsive to the clock signal, and wherein the control circuitry further includes a different controller responsive to an output of the different comparator, the different controller to adjust the delay amount of the second delay circuit based on the output of the different comparator.

14. The device of claim 1, wherein the device is configured to sample a data signal synchronized with the clock signal according to a double data rate (DDR) protocol.

15. A method of sampling data, comprising:
  receiving a clock signal synchronized wit a data signal;
  generating a first sampling signal based on the clock signal, the first sampling signal delayed by a first delay with respect to the clock signal;

generating a second separate sampling signal based on the clock signal, the second separate sampling signal delayed by a second delay with respect to the clock signal, the second delay different than and independent from the first delay;

sampling the data signal based on the first sampling signal; and sampling the data signal based on the second sampling signal.

16. A method of sampling data, comprising:

receiving a clock signal synchronized with a data signal;

generating a first sampling signal based on the clock signal, the first sampling signal delayed by a first delay with respect to the clock signal;

generating a first locking signal delayed by twice the first delay with respect to the clock signal;

generating a second sampling signal based on the clock signal, the second sampling signal delayed by a second delay with respect to the clock signal, the second delay different than the first delay;

sampling the data signal based on the first sampling signal; and sampling the data signal based on the second sampling signal.

17. The method of claim 16, further comprising comparing the first locking signal to the clock signal.

18. The method of claim 17, further comprising modifying the first delay based on the comparing.

19. The method of claim 15, further comprising generating a second locking signal delayed by twice the second delay with respect to the clock signal.

20. The method of claim 19, further comprising comparing the second locking signal to the clock signal.

21. The method of claim 19, further comprising modifying the second delay based on the comparing.

22. The method of claim 15, wherein sampling the data signal based on the first sampling signal comprises sampling the data signal at a midpoint between a first edge and a second edge of the clock signal, wherein the second edge is the next successive edge of the clock signal after the first edge.

23. The method of claim 22, wherein sampling the data signal based on the second sampling signal comprises sampling the data signal at a midpoint between the second edge of the clock signal and a third edge of the clock signal, wherein the third edge is the next successive edge of the clock signal after the second edge.

24. The method of claim 23, wherein the first edge is a rising edge, the second edge is a falling edge, and the third edge is a rising edge.

25. The method of claim 23, wherein the first edge is a falling edge, the second edge is a rising edge, and the third edge is a falling edge.

26. A sampling device, comprising:

a first delaying means and a second delaying means in a parallel configuration, the first delaying means and the second delaying means for receiving a clock signal and for generating one or more delayed signals based on the clock signal, each of the first and second delaying means being independent and providing separate output signals to a data sampling means; and controlling means responsive to an output of the first delaying means and the clock signal, the controlling means for adjusting a delay amount of the first delaying means based on a difference between the output of the first delaying means and the clock signal, the controlling means further responsive to an output of the second delaying means, the controlling means further for adjusting a delay amount of the second delaying means based on a difference between the output of the second delaying means and the clock signal.

27. The device of claim 26, further including data sampling means, the data sampling means for sampling a data signal synchronized with the clock signal.

28. The device of claim 27, wherein the data sampling means is for sampling the data signal based on a sampling output of the first delaying means.

29. The device of claim 27, wherein the data sampling means is further for sampling the data signal based on a sampling output of the second delaying means.

30. A sampling device, comprising:

a first delaying means and a second delaying means in a parallel configuration, the first delaying means and the second delaying means for receiving a clock signal and for generating one or more delayed signals based on the clock signal, wherein the first delaying means includes a first delay element responsive to the clock signal and a second delay element responsive to an output of the first delay element; and controlling means responsive to an output of the first delaying means and the clock signal, the controlling means for adjusting a delay amount of the first delaying means based on a difference between the output of the first delaying means and the clock signal, the controlling means further responsive to an output of the second delaying means, the controlling means further for adjusting a delay amount of the second delaying means based on a difference between the output of the second delaying means and the clock signal.

31. The device of claim 30, further including data sampling means for sampling a data signal based on a sampling output of the first delay element.

32. A sampling device, comprising:

a first delaying means and a second delaying means in a parallel configuration, the first delaying means and the second delaying means for receiving a clock signal and for generating one or more delayed signals based on the clock signal, wherein the second delaying means includes a first inverting delay element responsive to the clock signal and a second inverting delay element responsive to an output of the first inverting delay element; and controlling means responsive to an output of the first delaying means and the clock signal, the controlling means for adjusting a delay amount of the first delaying means based on a difference between the output of the first delaying means and the clock signal, the controlling means further responsive to an output of the second delaying means, the controlling means further for adjusting a delay amount of the second delaying means based on a difference between the output of the second delaying means and the clock signal.

33. The device of claim 26, wherein the controlling means includes a comparing means responsive to the output of the first delaying means and responsive to the clock signal, and wherein the controlling means further includes a first delay controlling means responsive to an output of the comparing means, the first delay controlling means for adjusting the delay amount of the first delaying means based on the output of the comparing means.

34. A sampling device, comprising:

a first delaying means and a second delaying means in a parallel configuration, the first delaying means and the second delaying means for receiving a clock signal and for generating one or more delayed signals based on the clock signal; and controlling means responsive to an output of the first delaying means and the clock signal, the controlling means for adjusting a delay amount of the first delaying means based on a difference between the output of the first delaying means and the clock signal, the controlling means further responsive to an output of the second delaying means, the controlling means further for adjusting a delay amount of the second delaying means based on a difference between the output of the second delaying means and the clock signal; the controlling means includes a comparing means responsive to the output of the first delaying means and responsive to the clock signal, and wherein the controlling means further includes a first delay controlling means responsive to an output of the comparing means, the first delay controlling means for adjusting the delay amount of the first delaying means based on the output of the comparing means, wherein the comparing means comprises an inverting phase detection means.

35. The device of claim 34, wherein the inverting phase detection means comprises a phase difference detecting means and a sense amplifying means.

36. The device of claim 35, wherein the inverting phase detection means further comprises a latch.

37. The device of claim 34, wherein the inverting phase detection means comprises a flip flop.

38. The device of claim 33, wherein the controlling means further includes a different comparing means responsive to the output of the second delaying means and responsive to the clock signal, and wherein the controlling means thither includes a second delay controlling means responsive to an output of the different comparing means, the second delay controlling means for adjusting the delay amount of the second delaying means based on the output of the different comparing means.

39. The device of claim 26, wherein the device is configured to sample a data signal synchronized with the clock signal according to a double data rate (DDR) protocol.

* * * * *